United States Patent
Mukaide

(10) Patent No.: US 6,670,857 B2
(45) Date of Patent: Dec. 30, 2003

(54) AUDIO CLOCK RESTORING APPARATUS AND AUDIO CLOCK RESTORING METHOD

(75) Inventor: Takanobu Mukaide, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/195,437

(22) Filed: Jul. 16, 2002

(65) Prior Publication Data

US 2003/0020549 A1 Jan. 30, 2003

(30) Foreign Application Priority Data

Jul. 17, 2001 (JP) .................................... 2001-216988

(51) Int. Cl.[7] .............................................. H03B 27/00
(52) U.S. Cl. ............................ 331/46; 331/10; 331/11; 327/147
(58) Field of Search ........................ 331/10, 11, 12, 331/18, 20, 25, 34, 46; 375/373, 376; 348/536; 327/147, 155, 156

(56) References Cited

U.S. PATENT DOCUMENTS 5,519,444 A * 5/1996 Ko et al. ...................... 348/515
6,104,222 A * 8/2000 Embree ....................... 327/156
6,356,313 B1 * 3/2002 Champion et al. .......... 348/558

FOREIGN PATENT DOCUMENTS

JP  2000-350119  12/2000
JP  2001-022353  1/2001

* cited by examiner

Primary Examiner—Tuan T. Lam
Assistant Examiner—Hiep Nguyen
(74) Attorney, Agent, or Firm—Pillsbury Winthrop LLP

(57) ABSTRACT

An oscillation frequency of a VCXO is controlled based on a phase difference between a reference phase signal outputted from a reference phase generation circuit and a feedback phase signal outputted from a feedback phase generation circuit, an oscillation frequency of a VCO is controlled based on a phase difference between an output clock of the VCXO and an audio clock obtained from a divider circuit, and a clock outputted from the VCO is determined as a restored audio clock.

18 Claims, 4 Drawing Sheets

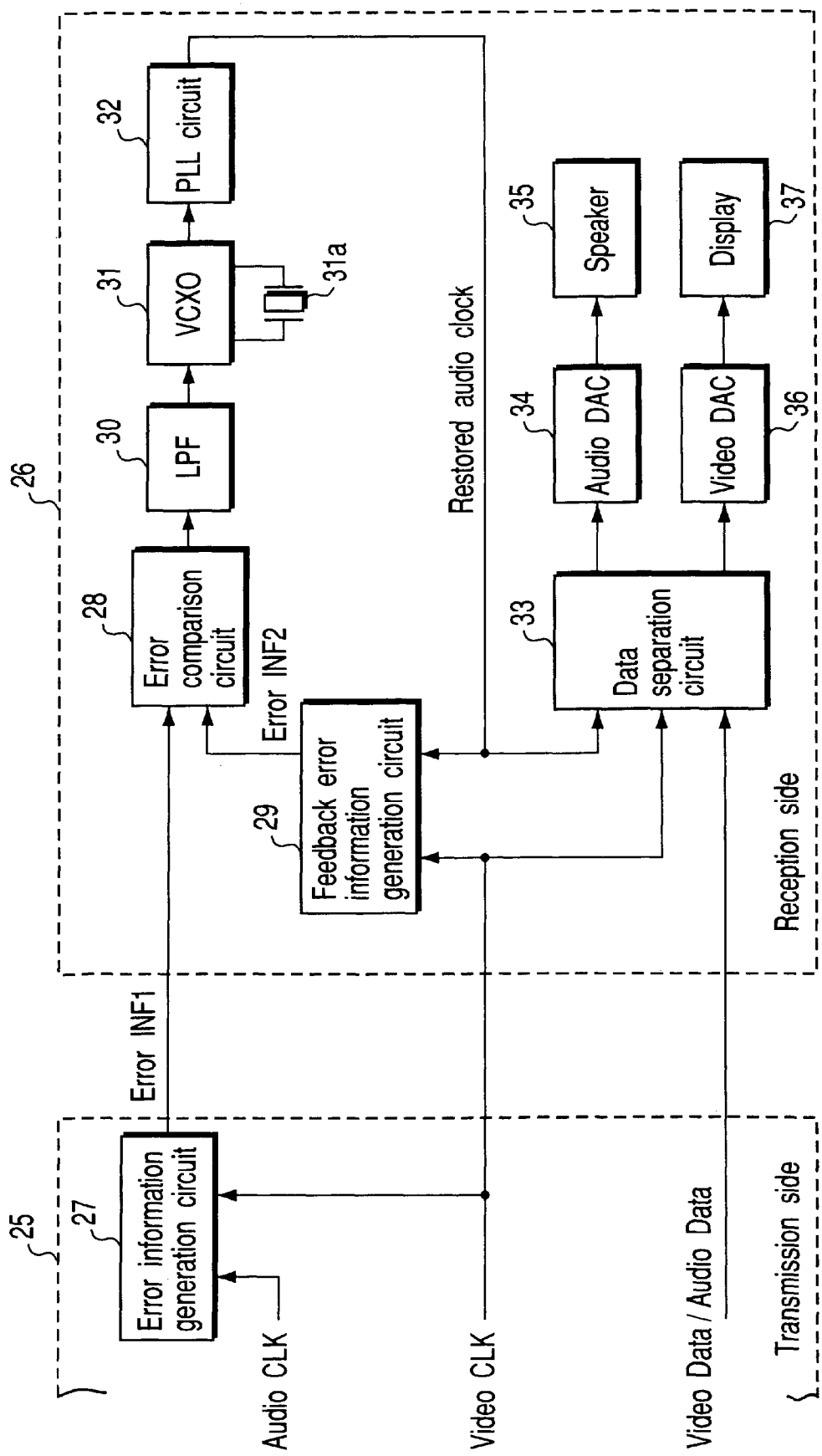
F I G. 3

AUDIO CLOCK RESTORING APPARATUS AND AUDIO CLOCK RESTORING METHOD

CROSS-REFERENCE TO RELATED APPLICATIONS

This application is based upon and claims the benefit of priority from the prior Japanese Patent Application No. 2001-216988, filed Jul. 17, 2001, the entire contents of which are incorporated herein by reference.

BACKGROUND OF THE INVENTION

1. Field of the Invention

The present invention relates to a transmission system which performs digital transmission of video data and audio data, and more particularly to improvement in an audio clock restoring apparatus and an audio clock restoring method which restore a sampling clock of audio data on its reception side.

2. Description of the Related Art

As is well known, in recent years, there becomes widely used a digital transmission system which transmits video data, audio data, a sampling clock of the video data and information indicative of the relationship between the sampling clock of the video data and the sampling clock of the audio data but does not transmit the sampling clock of the audio data itself.

In this digital transmission system, the sampling clock of the audio data must be restored on the reception side based on the sampling clock of the video data and information indicative of the relationship between the sampling clock of the video data and the sampling clock of the audio data.

Meanwhile, for restoring the sampling clock of the audio data as described above, the most important point lies in that a frequency or a phase of the sampling clock of the audio data to be restored on the reception side must coincide with a frequency or a phase of the sampling clock of the audio data used on the transmission side.

BRIEF SUMMARY OF THE INVENTION

In view of the above-described problem, it is an object of the present invention to provide an audio clock restoring apparatus and an audio clock restoring method which can match a frequency or a phase of an audio clock to be restored on the reception side with a frequency or a phase of an audio clock on the transmission side.

According to one aspect of the present invention, there is provided an audio clock restoring apparatus to which video data, audio data, a video clock and relevant information indicative of a phase difference between the video clock and an audio clock are inputted and which restores a restored audio clock based on the video clock and the relevant information, comprising:

a reference phase signal generation portion configured to generate a reference phase signal from the video clock and the relevant information;

a feedback phase signal generation portion configured to generate a feedback phase signal from a restored audio clock;

a first phase difference detection portion configured to compare the reference phase signal with the feedback phase signal in phase and to output a first error signal corresponding to a phase difference between the reference phase signal and the feedback phase signal;

a first oscillation portion whose oscillation frequency is based on the first error signal configured to output a first clock;

a second phase difference detection portion configured to compare the first clock with the restored audio clock in phase and to output a second error signal corresponding to a phase difference between the first clock and the restored audio clock; and a second oscillation portion whose oscillation frequency is based on the second error signal configured to output the restored audio clock.

According to another aspect of the present invention, there is provided an audio clock restoring method by which video data, audio data, a video clock and relevant information indicative of a phase difference between the video clock and the audio clock are inputted and which restores a restored audio clock based on the video clock and the relevant information, comprising:

generating a reference phase signal from the video clock and the relevant information;

generating a feedback phase signal from a restored audio clock;

comparing the reference phase signal with the feedback phase signal in phase and obtaining a first error signal corresponding to a phase difference between the reference phase signal and the feedback phase signal;

controlling an oscillation frequency of a first oscillation portion based on the first error signal;

comparing a first output clock from the first oscillation portion with the restored audio clock in phase and obtaining a second error signal corresponding to a phase difference between the first output clock and the restored audio clock; and controlling an oscillation frequency of a second oscillation portion based on the second error signal.

According to the structure and the method mentioned above, the oscillation frequency of the first oscillation portion is controlled based on a result of comparing the reference phase signal with the restored audio clock in phase, and the oscillation frequency of the second oscillation portion is controlled based on a result of comparing the output clock of the first oscillation portion with the restored audio clock in phase.

That is, since the restored audio clock is a target of comparison in two error detections, the audio clock to be restored can be accurately synchronized with the audio clock on the transmission side as compared with the structure in which two PLLs are simply connected to each other in the cascade manner.

BRIEF DESCRIPTION OF THE SEVERAL VIEWS OF THE DRAWING

FIG. 3 is a block diagram showing a second embodiment according to the present invention and used to schematically illustrate a digital video/audio transmission system.

DETAILED DESCRIPTION OF THE INVENTION

Figure 1:
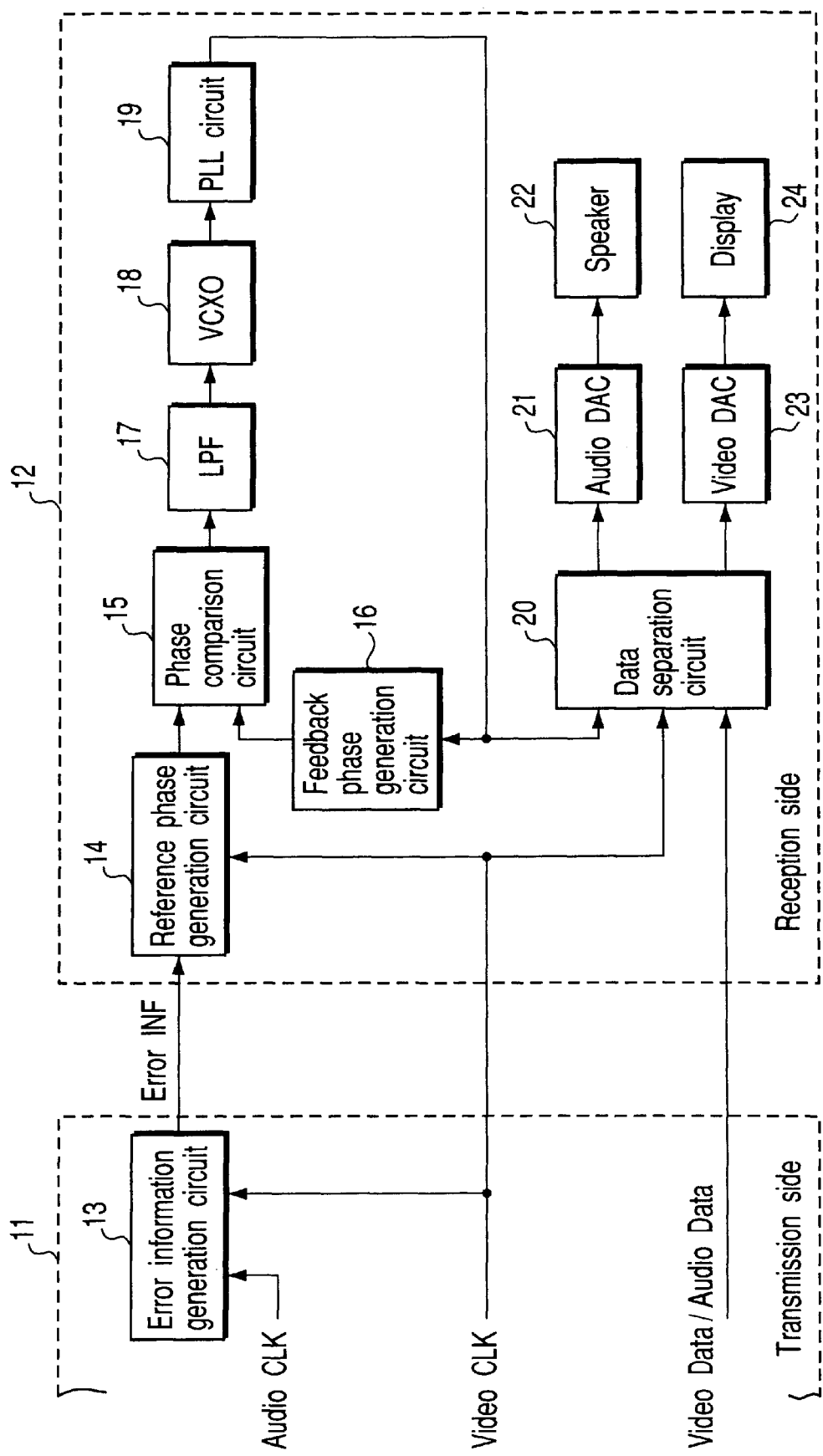
FIG. 1 is a block diagram showing a first embodiment according to the present invention and used to schematically illustrate a digital video/audio transmission system.

A first embodiment according to the present invention will now be described hereinafter in detail with reference to the accompanying drawings. FIG. 1 schematically shows a digital video/audio transmission system which will be described in connection with the first embodiment.

At first, on a transmission side 11, digital video data Video Data, digital audio data Audio Data and a video sampling clock Video CLK are transmitted to a reception side 12.

Further, on the transmission side 11, the video sampling clock Video CLK and an audio sampling clock Audio CLK are supplied to an error information generation circuit 13. This error information generation circuit 13 generates relevant information Error INF indicative of the error relationship between the video sampling clock Video CLK and a clock having a frequency which is n-times of that of the audio sampling clock Audio CLK, and transmits it to the reception side 12.

On the other hand, on the reception side 12, the received video sampling clock Video CLK and the relevant information Error INF are inputted to a reference phase generation circuit 14. The reference phase generation circuit 14 generates a reference phase signal used for generating the audio sampling clock Audio CLK based on the video sampling clock Video CLK and the relevant information Error INF. This reference phase signal is supplied to one input end of a phase comparison circuit 15.

To the other input of the phase comparison circuit 15 is supplied a feedback phase signal generated by a feedback phase generation circuit 16. Moreover, the phase comparison circuit 15 compares the reference phase signal with the feedback phase signal in phase, and generates a phase error signal corresponding to a phase difference between both the phase signals. This phase error signal is smoothed by an LPF (Low Pass Filter) 17 and then supplied to a VCXO [Voltage Control Xtal (crystal) Oscillator] 18. This signal is further used for controlling an oscillation frequency of the VCXO 18.

An output clock of the VCXO 18 is supplied to a PLL circuit 19 and used for generation of a clock synchronized with this output clock in phase. Moreover, a clock generated by the PLL circuit 19 is supplied to the feedback phase generation circuit 16 as a restored audio clock and also supplied to a data separation circuit 20.

In this case, the oscillation frequency of the VCXO 18 is understandably controlled so that the phase error between the reference phase signal outputted from the reference phase generation circuit 14 and the feedback phase signal outputted from the feedback phase generation circuit 16 can be eliminated.

In addition, the digital video data Video Data, the digital audio data Audio Data and the video sampling clock Video CLK transmitted from the transmission side 11 are supplied to the data separation circuit 20 on the reception side 12.

The data separation circuit 20 carries out restoration processing with respect to the digital video data Video Data and the digital audio data Audio Data inputted thereto by using the video sampling clock Video CLK and the restored audio clock.

The digital audio data Audio Data subjected to the restoration processing by the data separation circuit 20 is supplied to an audio DAC (Digital to Analog Converter) 21 where it is converted into analog data, and subjected to sound reproduction by a speaker 22.

Additionally, the digital video data Video Data subjected to the restoration processing by the data separation circuit 20 is supplied to a video DAC 23 where it is converted into analog data, and subjected to video display by a display 24.

Figure 2:
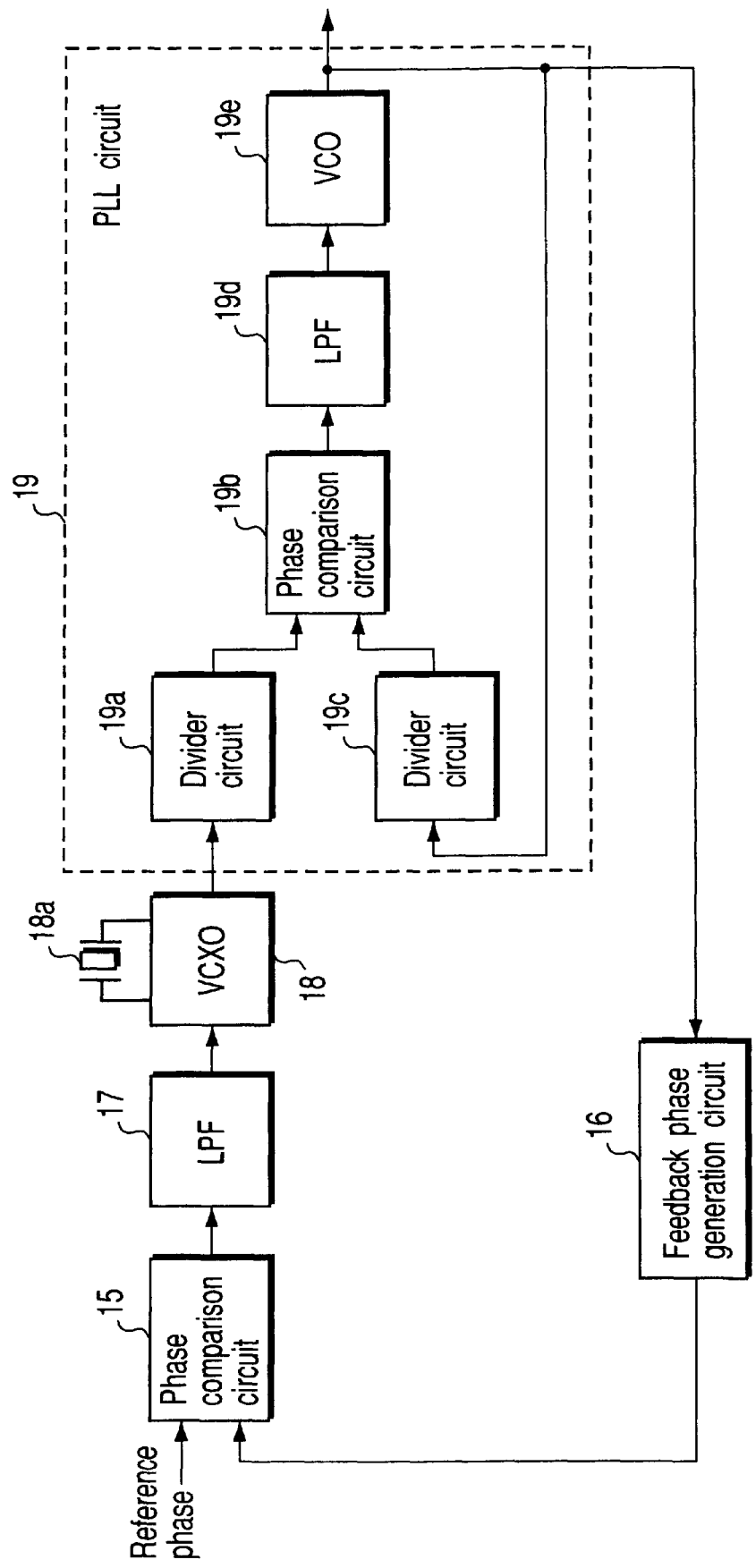
FIG. 2 is a block diagram illustrating a detailed structure of a PLL circuit in the first embodiment.

Here, FIG. 2 shows the detail of the PLL circuit 19. That is, the output clock of the VCXO 18 is supplied to one input end of a phase comparison circuit 19b through a divider circuit 19a.

The phase comparison circuit 19b compares a phase of the clock supplied to one input end thereof and a phase of the output clock of the divider circuit 19c supplied to the other input end thereof, and generates a phase error signal corresponding to a phase difference between the both clocks. This phase error signal is smoothed by an LPF 19d, and then supplied to a VCO (Voltage Control Oscillator) 19e. Further, this signal is used for controlling an oscillation frequency of the VCO 19e.

Furthermore, an output clock of the VCO 19e is supplied to the divider circuit 19c, the feedback phase generation circuit 16 and the data separation circuit 20 as a restored audio clock. In this case, the oscillation frequency of the VCO 19e is likewise controlled so that a phase difference between the output clock of the VCXO 18 and the output clock of the divider circuit 19c can be eliminated.

In the above-described digital video/audio transmission system, it is assumed that an oscillation frequency of a crystal oscillator 18a connected to the VCXO 18 and a frequency of the video sampling clock Video CLK are respectively 27.0 MHz which is a packet transmission frequency of MPEG (Moving Picture Image Coding Experts Group). Moreover, it is assumed that a frequency of the audio sampling clock Audio CLK and a frequency of the restored audio clock generated by the PLL circuit 19 are respectively 48 kHz.

In addition, the VCXO 18 first oscillates a clock having 27.0 MHz which is a packet transmission frequency of MPEG. The clock having 27.0 MHz oscillated by the VCXO 18 is supplied to the PLL circuit 19. The PLL circuit 19 consequently generates the restored audio clock having a frequency of 48 kHz with the clock having 27.0 MHz as a reference.

Thereafter, the restored audio clock generated by the PLL circuit 19 is used for generation of the feedback phase signal in the feedback phase generation circuit 16. Then, the feedback phase signal generated by the feedback phase generation circuit 16 is supplied to the phase comparison circuit 15 and used for generation of the phase error signal corresponding to a phase difference between itself and the reference phase signal. This phase error signal is used for controlling the oscillation frequency of the VCXO 18 through the LPF 17.

As a result, the clock (27.0 MHz) outputted from the VCXO 18 is synchronized with a frequency of the audio sampling clock Audio CLK on the transmission side 11 and a frequency which is n-times of the former frequency. Then, the PLL circuit 19 generates the restored audio clock with the clock oscillated by the VCXO 18 as a reference. The restored audio clock generated by the PLL circuit 19 is, therefore, synchronized with the audio sampling clock Audio CLK on the transmission side 11 and a clock having a frequency which is n-times the frequency of the audio sampling clock Audio CLK.

According to the first embodiment mentioned above, the oscillation frequency of the VCXO 18 is controlled based on a result of comparing a phase of the reference phase signal generated by the reference phase generation circuit 14 and a phase of the restored audio clock outputted from the PLL circuit 19. Additionally, the oscillation frequency of the VCO 19e is controlled based on a result of comparing a phase of the output clock from the VCXO 18 and a phase of the restored audio clock outputted from the PLL circuit 19.

That is, the two phase comparison circuits 15 and 19b use, as a target of comparison, phase information generated based on the output clock of the PLL circuit 19, namely, the clock finally used as the restored audio clock.

Accordingly, as in the prior art, the phase of the audio clock restored on the reception side 12 can be accurately synchronized with the phase of the audio sampling clock on the transmission side 11 and the phase of the clock having a frequency which is n-times the frequency of the audio sampling clock, as compared with the structure in which the two PLLs are simply cascade connected.

A second embodiment according to the present invention will now be described in detail with reference to the drawings. FIG. 3 schematically shows a digital video/audio transmission system described in connection with the second embodiment.

On the transmission side 25, the digital video data Video Data, the digital audio data Audio Data and the video sampling clock Video CLK are first transmitted to the reception side 26, respectively.

Also, on the transmission side 25, the video sampling clock Video CLK and the audio sampling clock Audio CLK are supplied to the error information generation circuit 27. This error information generation circuit 27 generates reference frequency error information Error INF1 indicative of a value obtained by counting an m cycle period of the clock having a frequency which is n-times that of the audio sampling clock Audio CLK by using the video sampling clock Video CLK, and transmits it to the reception side 26.

On the other hand, on the reception side 26, the received reference frequency error information Error INF1 is inputted to one input end of the error comparison circuit 28. To the other input end of the error comparison circuit 28 is supplied feedback frequency error information Error INF2 generated by the feedback error information generation circuit 29.

Then, the error comparison circuit 28 compares a frequency of the reference frequency error information Error INF1 with that of the feedback frequency error information Error INF2, and generates an error signal corresponding to a difference between these frequencies. This error signal is smoothed by the LPF 30 and then supplied to the VCXO 31. Thereafter, it is used for control over an oscillation frequency of the VCXO 31.

The output clock of the VCXO 31 is supplied to the PLL circuit 32, and used for generation of a clock synchronized with this output clock. Further, the clock generated by the PLL circuit 32 is supplied as the restored audio clock to the feedback error information generation circuit 29 as well as the data separation circuit 33.

In this case, the oscillation frequency of the VCXO 31 is understandably controlled so as to eliminate a difference between the reference frequency error information Error INF1 outputted from the error information generation circuit 27 and the feedback frequency error information Error INF2 outputted from the feedback error information generation circuit 29.

Furthermore, the digital video data Video Data, the digital audio data Audio Data and the video sampling clock Video CLK transmitted on the transmission side 25 are supplied to the data separation circuit 33 on the reception side 26.

The data separation circuit 33 applies decoding processing on the digital video data Video Data and the digital audio data Audio Data by using the video sampling clock Video CLK and the restored audio clock, respectively.

The digital audio data Audio Data subjected to the decoding processing in the data separation circuit 33 is supplied to the audio DAC 34 where it is converted into analog data, and subjected to audio reproduction by the speaker 35.

Moreover, the digital video data Video Data subjected to the decoding processing in the data separation circuit 33 is supplied to the video DAC 36 where it is converted into analog data, and subjected to video display in the display 37.

Figure 4:
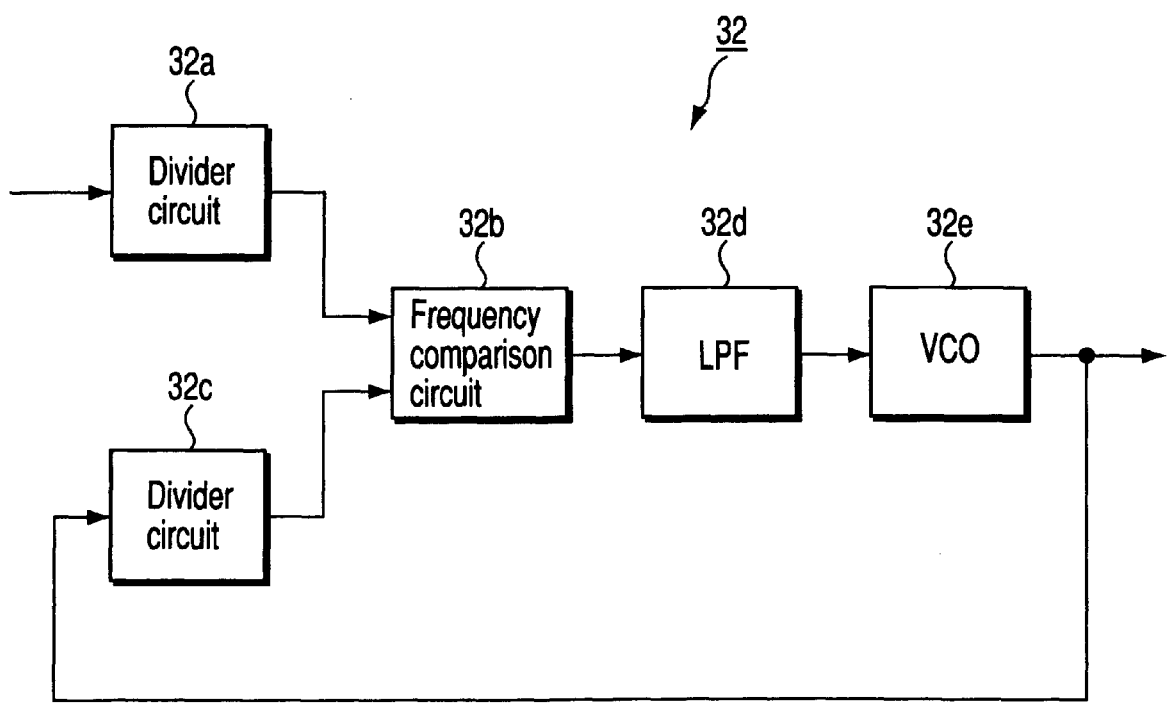
FIG. 4 is a block diagram illustrating a detailed structure of a PLL circuit in the second embodiment.

Here, FIG. 4 shows the detail of the PLL circuit 32. That is, the output clock of the VCXO 31 is supplied to one input end of a frequency comparison circuit 32b through a divider circuit 32a.

The frequency comparison circuit 32b compares a frequency of the clock supplied to one input end thereof and a frequency of the output clock of a divider circuit 32c supplied to the other input end thereof, and generates a frequency error signal corresponding to a frequency difference between the both clocks. This frequency error signal is smoothed by an LPF 32d, and then supplied to a VCO 32e. Further, this signal is used for controlling an oscillation frequency of the VCO 32e.

Furthermore, an output clock of the VCO 32e is supplied to the divider circuit 32c, the feedback error information generation circuit 29 and the data separation circuit 33 as a restored audio clock. In addition, the oscillation frequency of the VCO 32e is controlled so as to eliminate a frequency difference between the output clocks from the respective divider circuits 32a and 32c.

In the above-described digital video/audio transmission system, the oscillation frequency of a crystal oscillator 31a and the frequency of the video sampling clock Video CLK are determined as 27.0 MHz which is a packet transmission frequency of MPEG, respectively. Additionally, frequencies of the audio sampling clock Audio CLK and the output clock of the PLL circuit 32 are determined as 48 kHz, respectively.

Further, the VCXO 31 first oscillates the clock of 27.0 MHz which is the packet transmission frequency of MPEG. The clock of 27.0 MHz oscillated by the VCXO 31 is supplied to the PLL circuit 32. As a result, the PLL circuit 32 generates the restored audio clock having a frequency of 48 kHz with the clock of 27.0 MHz as a reference.

Thereafter, the m cycle period of the restored audio clock generated by the PLL circuit 32 is counted with the clock of 27.0 MHz which is the video sampling clock Video CLK by the feedback error information generation circuit 29.

Then, the feedback frequency error information Error INF2 generated by the feedback error information generation circuit 29 (when the counting period is one-cycle period, a result is 562 or 563 based on 27 MHz/48 kHz= 562.5) is supplied to the error comparison circuit 28 and used for generation of an error signal corresponding to a frequency difference between itself and the reference frequency error information Error INF1. This error signal is devoted to controlling the oscillation frequency of the VCXO 31 through the LPF 30.

As a result, the clock (27.0 MHz) outputted from the VCXO 31 is synchronized with the audio sampling clock Audio CLK and a frequency which is n-times that of the audio sampling clock Audio CLK on the transmission side 25. Then, the PLL circuit 32 generates the restored audio clock with the clock oscillated by the VCXO 31 as a reference. Thus, the restored audio clock generated by the PLL circuit 32 is synchronized with the audio sampling clock Audio CLK on the transmission side 25 and the clock having a frequency which is n-times that of the audio sampling clock Audio CLK.

According to the second embodiment mentioned above, the oscillation frequency of the VCXO 31 is controlled based on a result of comparing the frequency of the reference frequency error information Error INF1 generated by the error information generation circuit 27 with the frequency of the feedback frequency error information Error INF2 generated by the feedback error information generation circuit 29.

Furthermore, the oscillation frequency of the VCO 32e is controlled based on a result of comparing the frequency of the output clock from the VCXO 31 with the frequency of the restored audio clock outputted from the PLL circuit 32.

That is, the error comparison circuit 28 and the PLL circuit 32 both use as a target of comparison the output clock of the PLL circuit 32, i.e., the information generated based on the clock finally used as the restored audio clock.

Therefore, as with the prior art, the frequency of the audio clock restored on the reception side 26 can be caused to accurately coincide with the audio sampling clock and the frequency of the clock which is n-times that of the audio sampling clock on the transmission side 25.

It is to be noted that, in the first and second embodiments mentioned above, the frequency oscillated by each of the crystal oscillators 18a and 31a and the VCXOs 18 and 31 is not restricted to 27.0 Mz which is a packet transmission frequency of MPEG, and it may be a frequency which an integral multiple of that frequency.

Further, although the audio clock generated by each of the PLL circuits 19 and 32 have a frequency equal to that of the audio sampling clock Audio CLK, the audio clock may have any frequency as long as it is an integral multiple of that of the audio sampling clock Audio CLK.

Furthermore, among the audio DACs realized as a commercially available IC (Integrated Circuit), some include therein the VCXO and a programmable PLL which generates the audio sampling clock whose frequency is n-times, and hence there is advantage that the circuit can be readily realized by utilizing such a commercially available audio DAC.

Incidentally, the present invention is not restricted to each of the above-described embodiments, and various modifications can be carried out without departing from the scope of the invention.

What is claimed is:

1. An apparatus to which a video clock and relevant information between said video clock and an audio clock are inputted and which restores a restored audio clock based on said video clock and said relevant information, said apparatus comprising:
 a reference signal generation portion configured to generate a reference signal from said video clock and said relevant information;
 a feedback signal generation portion configured to generate a feed back signal from said restored audio clock;
 a first error detection portion configured to compare said reference signal with said feedback signal and to output a first error signal;
 a first clock generation portion configured to generate a first clock from said first error signal;
 a second error detection portion configured to compare the first clock with said restored audio clock and to output a second error signal
 a second clock generation portion configured to generate said restored audio clock from said second error signal.

2. An audio clock restoring apparatus to which video data, audio data, a video clock and relevant information indicative of a phase difference between said video clock and an audio clock are inputted and which restores a restored audio clock based on said video clock and said relevant information, said apparatus comprising:
 a reference phase signal generation portion configured to generate a reference phase signal from said video clock and said relevant information;
 a feedback phase signal generation portion configured to generate a feedback phase signal from said restored audio clock;
 a first phase difference detection portion configured to compare said reference phase signal with said feedback phase signal in phase and to output a first error signal corresponding to a phase difference between said reference phase signal and said feedback phase signal;
 a first oscillation portion whose oscillation frequency is based on said first error signal configured to output a first clock;
 a second phase difference detection portion configured to compare the first clock with said restored audio clock in phase and to output a second error signal corresponding to a phase difference between said first clock and said restored audio clock; and
 a second oscillation portion whose oscillation frequency is based on said second error signal configured to output said restored audio clock.

3. The apparatus to restore an audio clock according to claim 2, wherein a frequency of said first clock outputted from said first oscillation portion is set to an integral multiple of a packet transmission frequency in MPEG.

4. The apparatus to restore an audio clock according to claim 2, wherein a frequency of said second clock outputted from said second oscillation portion is set to an integral multiple of a frequency of an audio sampling clock.

5. An apparatus to which a video clock and reference error information indicative of the relationship between said video clock and an audio clock are inputted and which restores a restored audio clock based on said video clock and said reference error information, said apparatus comprising:
 a feedback error information generation portion configured to generate feedback error information indicative of the relationship between said video clock and said restored audio clock;
 a first error detection portion configured to compare said feedback error information with said reference error information and to output a first error signal;
 a first clock generation portion configured to generate a first clock based on said first error signal;
 a second error detection portion configured to compare the first clock with said restored audio clock and to output a second error signal; and
 a second clock generation portion configured to generate said restored audio clock from said second error signal.

6. An audio clock restoring apparatus to which video data, audio data, a video clock and reference frequency error information indicative of the relationship between said video clock and an audio clock are inputted and which restores a restored audio clock based on said video clock and said reference frequency error information, said apparatus comprising:
 a feedback error information generation portion configured to generate feedback frequency error information indicative of the relationship between said video clock and said restored audio clock;
 a first error detection portion configured to compare said feedback frequency error information with said reference frequency error information in frequency and to output a first error signal corresponding to a difference between said feedback frequency error information and said reference frequency error information;

a first oscillation portion whose oscillation frequency is based on said first error signal configured to output a first clock;

a second error detection portion configured to compare the first clock with said restored audio clock in frequency and to output a second error signal corresponding to a difference between said first clock and said restored audio clock; and a second oscillation portion whose oscillation frequency is based on said second error signal configured to output said restored audio clock.

7. The apparatus to restore an audio clock according to claim 6, wherein a frequency of a first clock outputted from said first oscillation portion is set to an integral multiple of a packet transmission frequency in MPEG.

8. The apparatus to restore an audio clock according to claim 6, wherein a frequency of a second clock outputted from said second oscillation portion is set to an integral multiple of a frequency of an audio sampling clock.

9. An audio clock restoring apparatus to which video data, audio data, a video clock and relevant information indicative of a phase difference between said video clock and an audio clock are inputted and which restores a restored audio clock based on said video clock and said relevant information, said apparatus comprising:

reference phase signal generating means for generating a reference phase signal from said video clock and said relevant information;

feedback phase signal generating means for generating a feedback phase signal from said restored audio clock;

first phase difference detecting means for comparing the reference phase signal with said feedback phase signal in phase and to output a first error signal corresponding to a phase difference between said reference phase signal and said feedback phase signal;

first oscillating means whose oscillation frequency is based on said first error signal for outputting a first clock;

second phase difference detecting means for comparing the first clock with said restored audio clock in phase and to output a second error signal corresponding to a phase difference between said first clock and said restored audio clock; and second oscillating means whose oscillation frequency is based on said second error signal for outputting said restored audio clock.

10. An audio clock restoring apparatus to which video data, audio data, a video clock and reference frequency error information indicative of the relationship between said video clock and an audio clock are inputted and which restores a restored audio clock based on said video clock and said reference frequency error information, said apparatus comprising:

feedback error information generating means for generating feedback frequency error information indicative of the relationship between said video clock and said restored audio clock;

first error detecting means for comparing said feedback frequency error information with said reference frequency error information in frequency and to output a first error signal corresponding to a difference between said feedback frequency error information and said reference frequency error information;

first oscillating means whose oscillation frequency is based on said first error signal for outputting a first clock;

second error detecting means for comparing the first clock with said restored audio clock in frequency and to output a second error signal corresponding to a difference between said first clock and said restored audio clock; and second oscillating means whose oscillation frequency is based on said second error signal for outputting said restored audio clock.

11. An audio clock restoring method by which video data, audio data, a video clock and relevant information indicative of a phase difference between said video clock and an audio clock are inputted and which restores a restored audio clock based on said video clock and said relevant information, said method comprising:

generating a reference phase signal from said video clock and said relevant information;

generating a feedback phase signal from said restored audio clock;

comparing said reference phase signal with said feedback phase signal in phase and obtaining a first error signal corresponding to a phase difference between said reference phase signal and said feedback phase signal;

controlling an oscillation frequency of a first oscillation portion based on said first error signal;

comparing a first output clock of said first oscillation portion with said restored audio clock in phase and obtaining a second error signal corresponding a phase difference between said first output clock and said restored audio clock; and controlling an oscillation frequency of a second oscillation portion based on said second error signal.

12. The audio clock restoring method according to claim 11, wherein a frequency of said first output clock outputted from said first oscillation portion is set to an integral multiple of a packet transmission frequency in MPEG.

13. The audio clock restoring method according to claim 11, wherein a frequency of a clock outputted from said second oscillation portion is set to an integral multiple of a frequency of an audio sampling clock.

14. An audio clock restoring method by which video data, audio data, a video clock and reference frequency error information indicative of the relationship between said video clock and an audio clock are inputted and which restores a restored audio clock based on said video clock and said reference frequency error information, said method comprising:

generating feedback frequency error information indicative of the relationship between said video clock and said restored audio clock;

comparing said feedback frequency error information with said reference frequency error information in frequency and obtaining a first error signal corresponding to a difference between said feedback frequency error information and said reference frequency error information;

controlling an oscillation frequency of a first oscillation portion based on said first error signal;

comparing a first output clock of said first oscillation portion with said restored audio clock in frequency and obtaining a second error signal corresponding to a difference between said first output clock and said restored audio clock; and controlling an oscillation frequency of a second oscillation portion based on said second error signal.

15. The audio clock restoring method according to claim 14, wherein a frequency of said first output clock outputted from said first oscillation portion is set to an integral multiple of a packet transmission frequency in MPEG.

16. The audio clock restoring method according to claim 14, wherein a frequency of said clock outputted from said second oscillation portion is set to an integral multiple of a frequency of an audio sampling clock.

17. An audio clock restoring method by which video data, audio data, a video clock and relevant information indicative of a phase difference between said video clock and an audio clock are inputted and which restores a restored audio clock based on said video clock and said relevant information, said method comprising:

a reference phase signal generation step which generates a reference phase signal from said video clock and said relevant information;

a feedback phase signal generation step which generates a feedback phase signal from said restored audio clock;

a first phase difference detection step which compares said reference phase signal with said feedback phase signal in phase and obtains a first error signal corresponding to a phase difference between said reference phase signal and said feedback phase signal;

a first oscillation step which controls an oscillation frequency of a first oscillation portion based on said first error signal;

a second phase difference detection step which compares a first output clock of said first oscillation portion with said restored audio clock in phase and obtains a second error signal corresponding to a phase difference between said first output clock and said restored audio clock; and a second oscillation step which controls an oscillation frequency of a second oscillation portion based on said second error signal.

18. An audio clock restoring method by which video data, audio data, a video clock and reference frequency error information indicative of the relationship between said video clock and an audio clock are inputted and which restores a restored audio clock based on said video clock and said reference frequency error information, said method comprising:

a feedback error information generation step which generates feedback frequency error information indicative of the relationship between said video clock and said restored audio clock;

a first error detection step which compares said feedback frequency error information with said reference frequency error information in frequency and obtains a first error signal corresponding to a difference between said feedback frequency error information and said reference frequency error information;

a first oscillation step which controls an oscillation frequency of a first oscillation portion based on said first error signal;

a second error detection step which compares a first output clock of said first oscillation portion with said restored audio clock in frequency and obtains a second error signal corresponding to a difference between said first output clock and said restored audio clock; and a second oscillation step which controls an oscillation frequency of a second oscillation portion based on said second error signal.

* * * * *